United States Patent
Wang et al.

(10) Patent No.: US 12,387,978 B2
(45) Date of Patent: Aug. 12, 2025

(54) RU LINER ABOVE A BARRIER LAYER

(71) Applicant: Applied Materials, Inc., Santa Clara, CA (US)

(72) Inventors: Zhaoxuan Wang, Sunnyvale, CA (US); Jianxin Lei, Fremont, CA (US); Wenting Hou, San Jose, CA (US); Sung-Kwan Kang, San Jose, CA (US); Anand Nilakantan Iyer, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 328 days.

(21) Appl. No.: 17/970,872

(22) Filed: Oct. 21, 2022

(65) Prior Publication Data

US 2024/0136223 A1 Apr. 25, 2024
US 2024/0234204 A9 Jul. 11, 2024

(51) Int. Cl.
*H01L 21/768* (2006.01)
*H01L 23/532* (2006.01)

(52) U.S. Cl.
CPC .. *H01L 21/76841* (2013.01); *H01L 21/76829* (2013.01); *H01L 23/53266* (2013.01)

(58) Field of Classification Search
CPC ......... H01L 21/76841; H01L 23/53266; H01L 21/76829; H01L 21/76834; H01L 23/53252
See application file for complete search history.

(56) References Cited

U.S. PATENT DOCUMENTS

| | | | |
|---|---|---|---|
| 9,677,172 | B2 | 6/2017 | Ha et al. |
| 10,734,235 | B2 | 8/2020 | Ramalingam et al. |
| 2002/0058414 | A1 | 5/2002 | Derderian et al. |
| 2019/0122923 | A1 | 4/2019 | Wang et al. |
| 2020/0388533 | A1 | 12/2020 | You et al. |
| 2021/0233770 | A1* | 7/2021 | Ren ..................... C23C 14/24 |
| 2021/0234095 | A1 | 7/2021 | Kong et al. |
| 2021/0272604 | A1 | 9/2021 | Kang et al. |
| 2021/0351136 | A1* | 11/2021 | Shen ................. H01L 21/76877 |
| 2022/0068805 | A1 | 3/2022 | Lee et al. |
| 2022/0293528 | A1 | 9/2022 | Chin et al. |

OTHER PUBLICATIONS

PCT International Search Report and Written Opinion for PCT/US2023/035532 dated Feb. 16, 2024.

* cited by examiner

*Primary Examiner* — Thanhha S Pham
(74) *Attorney, Agent, or Firm* — Moser Taboada

(57) ABSTRACT

A method to produce a layered substrate, which includes the steps of depositing a diffusion barrier layer on the substrate; depositing an underlayer comprising a Group 6 metal on the barrier layer; and depositing a ruthenium layer comprising ruthenium on the underlayer, to produce the layered substrate. A layered substrate is also disclosed.

14 Claims, 3 Drawing Sheets

RU LINER ABOVE A BARRIER LAYER

FIELD

Embodiments of the present disclosure generally relate to the field of semiconductor manufacturing processes, more particularly, to processes to produce layered semiconductor substrates.

BACKGROUND

Portions of a substrate are covered by a conductive diffusion barrier layer, and the diffusion barrier layer is covered by another conductive material. Suitable barrier layers may include a titanium (Ti)/titanium nitride (TiN) barrier. However, the inventors have observed typical nitride barrier layers to be problematic as the conductive layers have a roughness that may have a potentially negative impact on the final product. Accordingly, the inventors have provided an improved method for producing a layered substrate which addresses these and other issues.

SUMMARY

Methods for producing a layered substrate are provided herein. In embodiments, a layered substrate is provided. In some embodiments, a method to produce a layered substrate comprises the steps of depositing a diffusion barrier layer on the substrate; depositing an underlayer comprising a Group 6 metal on the barrier layer; and depositing a ruthenium layer comprising ruthenium on the underlayer, to produce the layered substrate.

In other embodiments, a layered substrate comprises a diffusion barrier layer, an underlayer comprising a Group 6 metal disposed on the barrier layer and a ruthenium layer comprising ruthenium disposed on the underlayer, having an average roughness Ra and a root mean square roughness Rq of less than or equal to about 2 nm.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
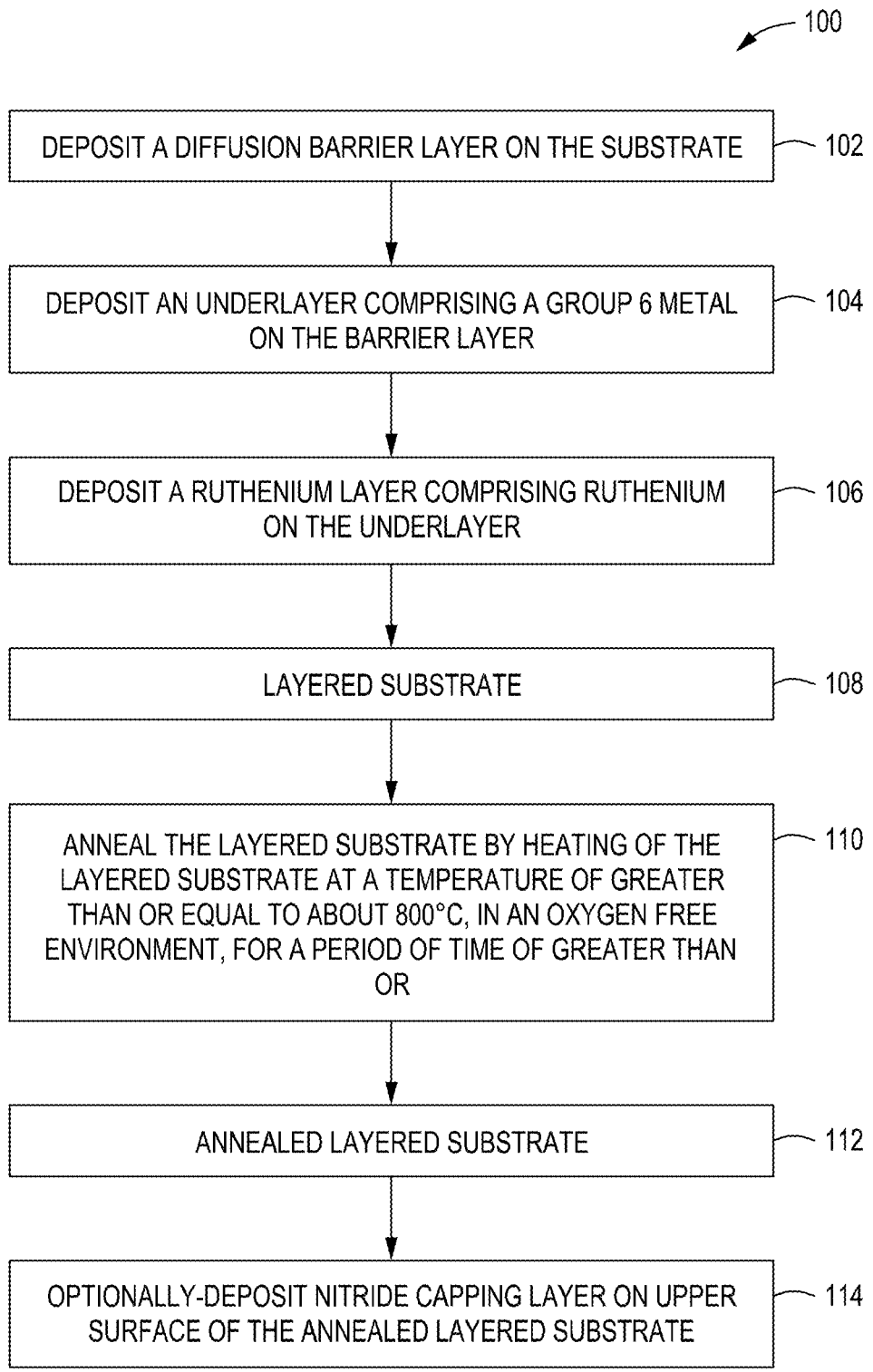
FIG. 1 depicts a flow diagram of a method for producing a layered substrate of a semiconductor device in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

For purposes of the present disclosure and the claims hereto, the numbering scheme for the Periodic Table Groups is according to the new notation of the IUPAC Periodic Table of Elements.

In embodiments, a method to produce a layered substrate comprises the steps of depositing a diffusion barrier layer on the substrate; depositing an underlayer comprising a Group 6 metal on the barrier layer; and depositing a ruthenium layer comprising ruthenium on the underlayer, to produce the layered substrate. In embodiments, the diffusion barrier layer comprises titanium nitride $Ti_aN_x$, tantalum nitride, $Ta_aN_x$, zirconium nitride $Zr_aN_x$, wherein each a is independently from 1 to 3 and x is from 1 to 5 to result in a neutral compound; titanium zirconium nitride $Ti_cZr_dN$, wherein c+d equals an integer from 1 to 3 and x is from 1 to 5 to result in a neutral compound; or a combination thereof. In some embodiments, the diffusion barrier layer further comprises less than or equal to about 1 weight percent of the Group 6 metal present in the underlayer.

In embodiments, the underlayer comprises molybdenum. In other embodiments, the underlayer consists essentially of molybdenum. In some embodiments, the ruthenium layer consists essentially of ruthenium. In embodiments, the underlayer has a thickness which is less than a thickness of the ruthenium layer. In some embodiments, the underlayer has a thickness of greater than or equal to about 0.5 nm, and less than or equal to about 2 nm. In embodiments, the ruthenium layer has a thickness of greater than or equal to about 5 nm, and less than or equal to about 1000 nm.

In some embodiments, the method further comprises the step of annealing the layered substrate by heating of the layered substrate at a temperature of greater than or equal to about 800° C., in an oxygen free environment, for a period of time of greater than or equal to about 5 seconds and less than or equal to about 500 seconds. In some embodiments, the oxygen free environment comprises nitrogen, argon, neon, krypton, or a combination thereof.

In embodiments, an upper surface of the annealed layered substrate has an average roughness Ra of less than or equal to about 2 nm. In embodiments, an upper surface of the annealed layered substrate has a root mean square roughness Rq of less than or equal to about 2 nm. In embodiments, the conductive layer has a center point resistivity of less than or equal to about 10 ohm-cm.

In embodiments, the underlayer and the ruthenium layer are individually deposited via physical vapor deposition.

Figure 2A:
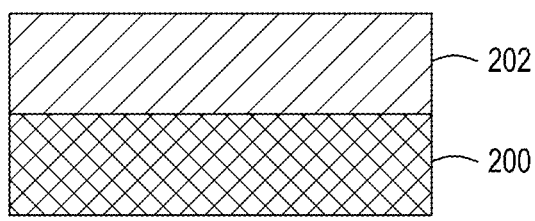
FIG. 2a depicts a block diagram of a partially completed layered substrate according to embodiments disclosed herein.
Figure 2B:
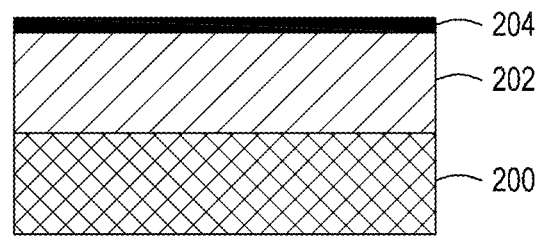
FIG. 2b depicts a block diagram of a partially completed layered substrate according to embodiments disclosed herein.
Figure 2C:
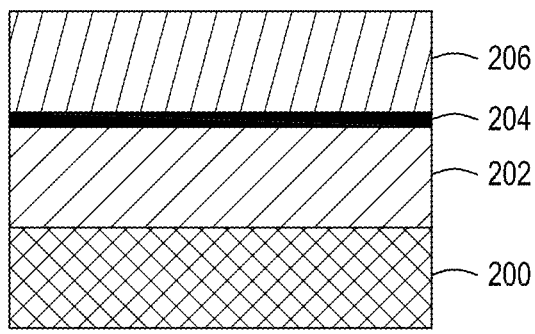
FIG. 2c depicts a block diagram of a layered substrate according to embodiments disclosed herein.
Figure 2D:
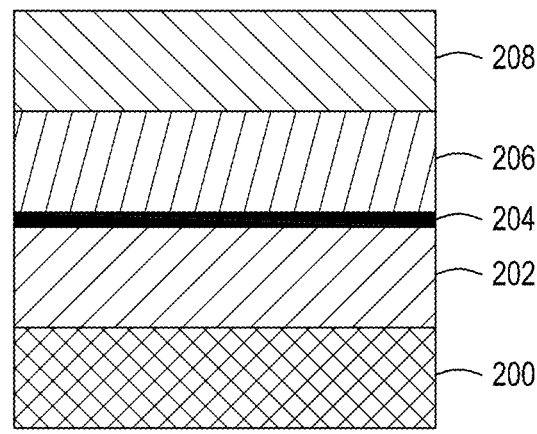
FIG. 2d depicts a block diagram of another embodiment of a layered substrate according to embodiments disclosed herein.

In some embodiments, the method further comprises the step of depositing a nitride capping layer, also referred to in the art as a furnace cap, on the layered substrate to produce a capped layered substrate (see FIG. 2d). In embodiments, the nitride capping layer comprises silicon nitride. In embodiments, the method further comprises depositing the nitride capping layer on an upper surface of an annealed layered substrate.

In embodiments, a layered substrate comprises a diffusion barrier layer, an underlayer comprising a Group 6 metal disposed on the barrier layer and a ruthenium layer comprising ruthenium disposed on the underlayer, having an average roughness Ra and a root mean square roughness Rq of less than or equal to about 2 nm. In embodiments, the layered substrate is produced according to any one or combination of methods disclosed herein. In embodiments of the layered substrate, the underlayer consists essentially of molybdenum, the ruthenium layer consists essentially of ruthenium, or both.

FIG. 1 is a flow diagram of a method 100, for producing a layered substrate in accordance with some embodiments of the present disclosure. The method 100 is described below with respect to the stages of the method as depicted in FIGS. 2a through 2d, and may be performed, for example, in a suitable cluster tool and process chambers, such as described below with respect to FIG. 3. Exemplary processing systems that may be used to perform the methods disclosed herein may include, but are not limited to, any commercially available processing systems from Applied Materials, Inc., of Santa Clara, California. Other process chambers, including ones available from other manufacturers may also be suitably used in connection with the teachings provided herein.

Figure 3:
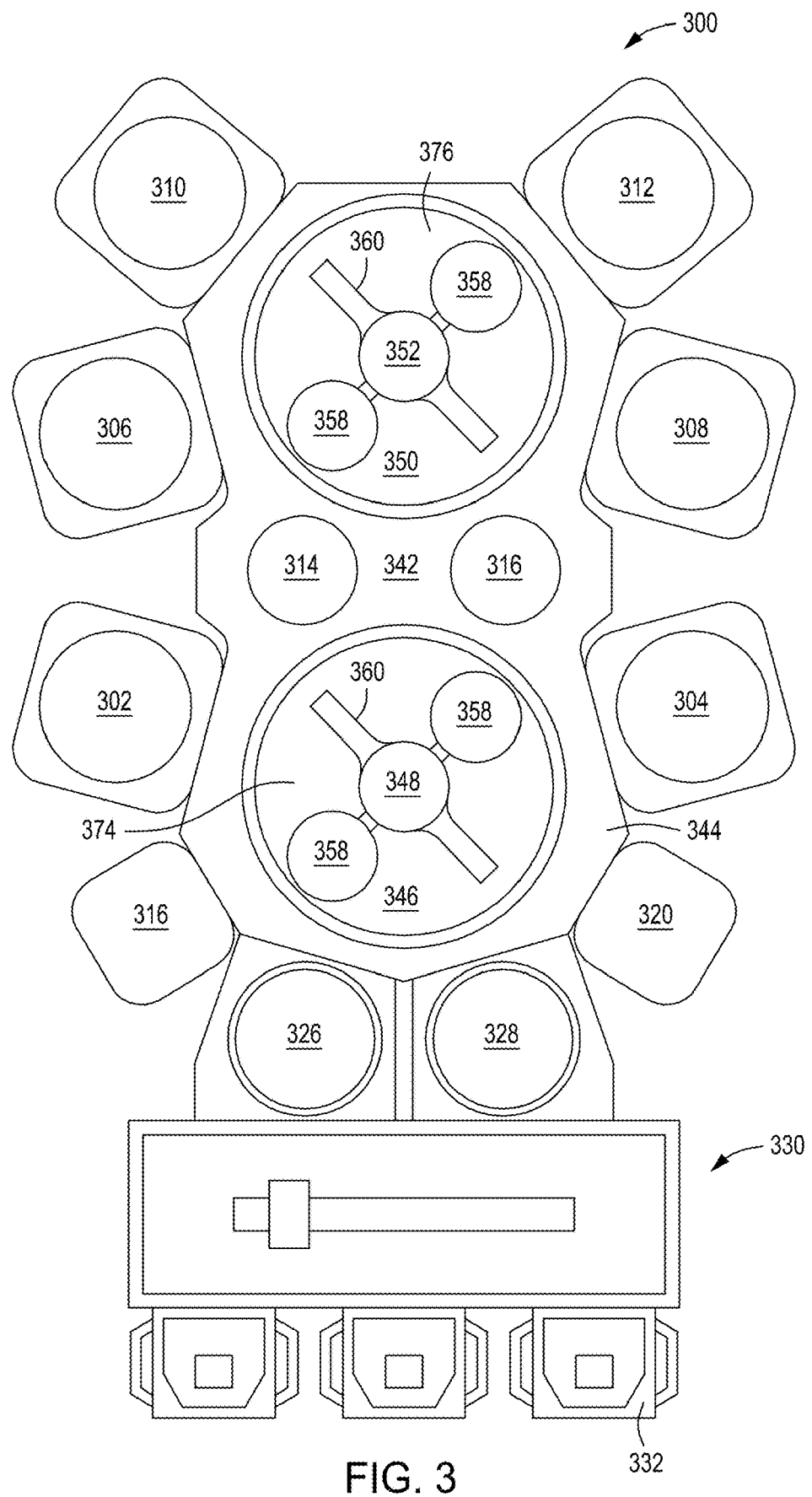
FIG. 3 depicts a cluster tool suitable to perform the method to produce a layered substrate according to embodiments disclosed herein.

The method 100 is typically performed on a substrate 200 (See FIGS. 2a-2d) provided to a processing volume of a process chamber, for example substrate processing chamber 314 and substrate processing chamber 338 described below with respect to FIG. 3. For simplicity, the substrate 200 as shown in FIGS. 2a-2d is flat surface. However, the substrate may include various features such as vias, trenches, or the like.

The substrate 200 may be any suitable substrate for use in a semiconductor article and may include one or more of silicon (Si), silicon oxide ($SiO_2$), or the like. In embodiments, the substrate 200 may include a plurality of layers, or may consist essentially of a dielectric layer. For example, a low-k material (e.g., a material having a dielectric constant less than silicon oxide, or less than about 3.9), or the like. In some embodiments, the dielectric layer may be disposed atop one or more additional dielectric layers (not shown), such as silicon oxide, silicon nitride, silicon carbide, or the like.

In addition, the substrate 200 may include additional layers of materials or may have one or more completed or partially completed structures or devices formed in or on the substrate 200. In some embodiments, a layer such as a logic device or the like, or a portion of a device requiring electrical connectivity, such as a gate, a contact pad, a conductive line or via, or the like, may be disposed in the substrate 200 and aligned with one or more features. As used herein, a "layer" need not be a continuous structure extending across an entire surface of the substrate.

In embodiments, the substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer.

The substrate 200 is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

Referring to FIG. 1 and FIGS. 2a-2d, in an embodiment, the method, generally referred to as 100, to produce a layered substrate (e.g., 200, See FIG. 2) comprises block 102, depositing a diffusion barrier layer (202, see FIG. 2a) atop the substrate. As shown in FIG. 2a, the diffusion barrier layer 202 is deposited on an upper surface of the substrate 200. The diffusion barrier layer 202 may be deposited on substrate 200 in a process chamber configured to deposit a layer (e.g., substrate processing chambers 312, 314 discussed below). In embodiments, the diffusion barrier layer 202 is deposited via physical vapor deposition, although any deposition method known in the art may be used. The diffusion barrier layer 202 may further enhance the adherence of a metal layer disposed upon the diffusion barrier layer 202.

In embodiments, the diffusion barrier layer 202 comprises a nitride, which in embodiments may include titanium nitride $Ti_aN_x$, tantalum nitride, $Ta_aN_x$, zirconium nitride $Zr_aN_x$, wherein each a is independently from 1 to 3 and x is from 1 to 5 to result in a neutral compound; titanium zirconium nitride $Ti_cZr_dN_x$, wherein c+d equals an integer from 1 to 3 and x is from 1 to 5 to result in a neutral compound; or a combination thereof.

In embodiments the nitride layer is deposited using reactive physical vapor deposition, e.g., by sputtering a titanium or tantalum target in a nitrogen/argon plasma. The diffusion barrier layer is configured to limit the diffusion of the underlayer and/or the ruthenium layer into the semiconductor substrate and the dielectric layer, thereby dramatically increasing the reliability of the connection. In embodiments, the diffusion barrier layer has a thickness greater than or equal to about 5 Å, or greater than or equal to about 50 Å, or greater than or equal to about 100 Å, or greater than or equal to about 150 Å, and less than or equal to about 1000 Å, or less than or equal to about 500 Å, or less than or equal to about 200 Å.

In some embodiments, the diffusion barrier layer further comprises an amount of the underlayer e.g., is doped with the material utilized in the underlayer in an amount effective to increase or facilitate adhesion between the diffusion barrier layer and the underlayer. In some embodiments, diffusion barrier layer further comprises the less than or equal to about 1 weight percent of the Group 6 metal present in the underlayer, or less than or equal to about 0.1 weight percent of the Group 6 metal present in the underlayer, or less than or equal to about 0.01 weight percent of the Group 6 metal present in the underlayer, based on the total amount of diffusion barrier layer present.

Next, the method 100 comprises block 104, depositing an underlayer (204) comprising a Group 6 metal on the barrier layer within a process chamber (see FIG. 2b). In embodiments, the underlayer 204 has a thickness which is less than a thickness of the ruthenium layer 206 discussed below. In embodiments, the underlayer has a thickness of greater than or equal to about 0.1 nm, or less than or equal to about 2 nm. In embodiments, the underlayer is deposited via physical vapor deposition.

In embodiments, the underlayer 204 may comprise or consist of a Group 6 metal i.e., chromium, molybdenum or tungsten. In embodiments, the underlayer consists essentially of pure molybdenum, defined herein is including no more than 5 wt % impurities. In other embodiments, the underlayer 204 comprises or consists essentially of a molybdenum alloy. For example, useful molybdenum alloys include molybdenum-tungsten alloys, molybdenum-chromium alloys, and/or alloys comprising one or more metals selected from Groups 3 through 14 of the periodic table of elements.

Next, the method 100 comprises block 106, depositing a ruthenium layer 206 comprising ruthenium on the underlayer 204 within a process chamber, followed by block 108, to produce the layered substrate 200, which is shown in FIG. 2c. In embodiments, the ruthenium layer 206 has a thickness of greater than or equal to about 5 nm, or less than or equal to about 500 nm. In embodiments, the underlayer 204 is deposited via physical vapor deposition.

In embodiments, the ruthenium layer 206 may comprise or consist of ruthenium metal. In embodiments, the ruthenium layer consists essentially of pure ruthenium, defined herein is including no more than 5 wt % impurities. In other embodiments, the ruthenium layer 206 comprises or consists essentially of a ruthenium alloy. Useful ruthenium alloys include alloys comprising ruthenium and one or more metals selected from Groups 3 through 14 of the periodic table of elements.

In some embodiments, method 100 further includes block 110, annealing of the layered substrate 200 by heating of the layered substrate 200 at a temperature of greater than or equal to about 800° C. for a period of time sufficient to remove internal stresses and irregularities present in the deposited ruthenium layer. In embodiments, the annealing of the substrate comprises or consists essentially of rapid thermal processing. In embodiments, the layer substrate 200 is heated in an oxygen free environment at a temperature of greater than or equal to about 800° C. for a period of time of greater than or equal to about 5 seconds, so called soak anneal. In some embodiments, the thermal process can be just quickly heating up the substrate to equal or greater than 1000 C then quickly cooling down, so called spike anneal. In some embodiments, the oxygen free environment comprises nitrogen, argon, neon, krypton, hydrogen, or a combination thereof.

In embodiments, the upper surface of the ruthenium layer after the annealing step has an average roughness Ra of less than or equal to about 2 nm, or less than or equal to about 1.8 nm, or less than or equal to about 1.5 nm, or less than or equal to about 1 nm. In embodiments, the upper surface of the ruthenium layer after the annealing step has a root mean square roughness Rq of less than or equal to about 2 nm, or less than or equal to about 1.8 nm, or less than or equal to about 1.5 nm, or less than or equal to about 1 nm. In some embodiments, the ruthenium layer has a center point resistivity of less than or equal to about 10 ohm-cm, or less than or equal to about 8 ohm-cm, or less than or equal to about 7 ohm-cm.

In embodiments, the process may be performed in a substrate processing chamber 338 (see FIG. 3), which can be any PVD chamber configured to deposit the diffusion barrier layer, and/or the underlayer and/or the ruthenium layer in the manner as disclosed herein. One exemplary PVD processing system suitable for modification in accordance with the teachings herein and for performing the above process is a PVD system commercially available from Applied Materials, Inc., of Santa Clara, California. In embodiments, suitable PVD chambers include those described in U.S. Pat. No. 8,795,487, issued Aug. 5, 2014 to Ritchie, et al., and U.S. Patent Publication Number 2002/0144889, published Oct. 10, 2002 to Rong Tao, et al.

To perform the deposition process RF and DC power is provided to a target containing the required material disposed within a PVD process chamber. In addition, the PVD process chamber is maintained at a pressure of about 4 mTorr to about 150 mTorr, or about 10 mTorr to about 150 mTorr. In embodiments, an RF bias power may be provided to the substrate support.

The PVD process includes suitable gases to facilitate the process. A gas source may provide a suitable gas species devoid of oxygen, such as an inert gas, such as argon, krypton, neon, or the like. The processing chamber may include a high temperature heater, suitable for heating the substrate to the appropriate annealing temperatures.

In some embodiments, target atoms strike the substrate. A deposition rate in an amount of 0.1-10 angstroms/sec. is suitable for use in accordance with the present disclosure. Accordingly, the physical vapor deposition chamber may be configured to apply a deposition rate in an amount of 0.1-10 angstroms/sec.

The methods described herein may be performed in individual process chambers that may be provided in a standalone configuration or as part of one or more cluster tools, for example, an integrated tool 300 (i.e., cluster tool) described below with respect to FIG. 3. In some embodiments, the method 100 of producing a layered substrate described above may be performed in individual process chambers provided as a standalone chamber or as part of a cluster tool. In embodiments, a cluster tool is configured for performing the methods for processing a substrate as described herein including: depositing the diffusion barrier layer, followed by the underlayer, and then followed by the ruthenium layer via a physical vapor deposition process.

Examples of the integrated tool 300 include integrated tools commercially available from Applied Materials, Inc., of Santa Clara, California. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks while processing.

The integrated tool 300 can include two load lock chambers 306A, 306B for transferring of substrates into and out of the integrated tool 300. Typically, since the integrated tool 300 is under vacuum, the load lock chambers 306 may "pump down" the substrates introduced into the integrated tool 300. A first robot 310 may transfer the substrates between the load lock chambers 306, and a first set of one or more substrate processing chambers 312, 314, 316, 318 (four are shown) coupled to a first central transfer chamber 350. Each substrate processing chamber 312, 314, 316, 318, can be outfitted to perform a number of substrate processing operations. In some embodiments, the first set of one or more substrate processing chambers 312, 314, 316, 318 may include any combination of PVD, ALD, CVD, etch, or degas chambers. For example, in some embodiments, the substrate processing chambers 312, and 314 include a CVD and/or ALD process chamber configured to deposit one or more of the diffusion barrier layer, the underlayer, the ruthenium layer, and/or the nitride capping layer.

The first robot 310 can also transfer substrates to/from two intermediate transfer chambers 322, 324. The intermediate transfer chambers 322, 324 can be used to maintain ultrahigh vacuum conditions while allowing substrates to be transferred within the integrated tool 300. A second robot 330 can transfer the substrates between the intermediate transfer chambers 322, 324 and a second set of one or more substrate processing chambers 332, 334, 335, 336, 338 coupled to a second central transfer chamber 355. The substrate processing chambers 332, 334, 335, 336, 338 can be outfitted to perform a variety of substrate processing operations including the method 100 described above in addition to, physical vapor deposition processes (PVD), chemical vapor deposition (CVD), etching, orientation and other substrate processes. In some embodiments, the second set of one or more substrate processing chambers 332, 334, 335, 336, 338 may include any combination of PVD, ALD, CVD, etch, or degas chambers. Any of the substrate processing chambers may be removed from the integrated tool 300 if not necessary for a particular process to be performed by the integrated tool 300.

Embodiments of the present disclosure further include a layered substrate produced according to one or more embodiments disclosed herein, comprising a diffusion barrier layer, an underlayer comprising a Group 6 metal disposed on the barrier and a ruthenium layer comprising ruthenium disposed on the underlayer, having an average roughness Ra and a root mean square roughness Rq of less than or equal to about 2 nm.

In some of such embodiments, the underlayer consists essentially of molybdenum, the ruthenium layer consists essentially of ruthenium, or both.

EMBODIMENTS

In accordance with embodiments of the disclosure, at least the following embodiments are contemplated.

E1. A method to produce a layered substrate, comprising:
depositing a diffusion barrier layer on the substrate;
depositing an underlayer comprising a Group 6 metal on the barrier layer; and
depositing a ruthenium layer comprising ruthenium on the underlayer, to produce the layered substrate.

E2. The method according to embodiment E1, wherein the diffusion barrier layer comprises $TiN_x$, $TaN_x$, $Zr_3N_4$, $TiZr_yN_x$, or a combination thereof.

E3. The method according to embodiment E1 or E2, wherein the diffusion barrier layer further comprises less than or equal to about 1 weight percent of the Group 6 metal present in the underlayer.

E4. The method according to any of embodiments E1 through E3, wherein the underlayer has a thickness which is less than a thickness of the ruthenium layer.

E5. The method according to any one of embodiments E1 through E4, wherein the underlayer has a thickness of greater than or equal to about 0.5 nm, and less than or equal to about 10 nm.

E6. The method according to any of embodiments E1 through E5, wherein the underlayer comprises molybdenum, or wherein the underlayer consists essentially of molybdenum.

E7. The method according to any of embodiments E1 through E6, wherein the ruthenium layer consists essentially of ruthenium.

E8. The method according to any of embodiments E1 through E7, wherein the ruthenium layer has a thickness of greater than or equal to about 5 nm, and less than or equal to about 1000 nm.

E9. The method according to any of embodiments E1 through E8, further comprising annealing of the layered substrate by heating of the layered substrate at a temperature of greater than or equal to about 800° C., in an oxygen free environment, for a period of time of greater than or equal to about 5 seconds and less than or equal to about 500 seconds.

E10. The method according to embodiment E9, wherein the oxygen free environment comprises nitrogen, argon, neon, krypton, hydrogen, or a combination thereof.

E11. The method according to embodiment E9 or E10, wherein an upper surface of the annealed layered substrate has an average roughness Ra of less than or equal to about 10 nm.

E12. The method according to any of embodiments E9 through E11, wherein an upper surface of the annealed layered substrate has a root mean square roughness Rq of less than or equal to about 10 nm.

E13. The method according to any of embodiments E9 through E12, wherein the ruthenium layer has a center point resistivity of less than or equal to about 10 ohm-cm.

E14. The method according to any of embodiments E1 through E13, wherein the underlayer and the ruthenium layer are individually deposited via physical vapor deposition.

E15. The method according to any of embodiments E9 through E14, further comprising depositing a nitride capping layer on an upper surface of the annealed layered substrate.

E16. The method according to embodiment E15, wherein the nitride capping layer comprises silicon nitride.

E17. A layered substrate comprising a diffusion barrier layer, an underlayer comprising a Group 6 metal disposed on the barrier layer and a ruthenium layer comprising ruthenium disposed on the underlayer produced according to any one of Embodiments E1 through E16.

E18. A layered substrate comprising a diffusion barrier layer, an underlayer comprising a Group 6 metal disposed on the barrier layer and a ruthenium layer comprising ruthenium disposed on the underlayer, having an average roughness Ra and a root mean square roughness Rq of less than or equal to about 2 nm.

E19. The layered substrate according to embodiment E17 or E18, wherein at least one of: the underlayer consists essentially of molybdenum, or the ruthenium layer consists essentially of ruthenium.

EXAMPLES

While the present disclosure has been described in conjunction with the specific embodiments thereof, the foregoing description is intended to illustrate and not limit the scope of the disclosure. Other aspects, advantages and modifications will be apparent to those skilled in the art to which the disclosure pertains.

Therefore, the following examples are put forth so as to provide those skilled in the art with a complete disclosure and description and are not intended to limit the scope of the disclosure.

The inventors have discovered that the relatively thin underlay of molybdenum affects the ruthenium layer during the annealing process. For example, the inventors have observed that annealing as described above results in the grain structure of the ruthenium layer, i.e., the crystalline growth, to orient along the X-Y plane parallel to the molybdenum underlayer with only limited, if any, crystalline growth and thus limit or diminish expansion of the ruthenium layer in a direction perpendicular to the molybdenum underlayer. Transmission electron micrographs of a comparative example at different levels of magnification, having a 200 Å ruthenium layer deposited via physical vapor deposition directly on a 30 Å layer of TiN on a silicon support, when annealed via rapid thermal processing (RTP) at 950° C. for 30 seconds in a nitrogen atmosphere, resulted in a ruthenium surface having a thickness ranging from 170 Å to about 300 Å.

Transmission electron micrographs of an inventive example taken at the same level of magnification as the comparative example having a 200 Å ruthenium layer deposited via physical vapor deposition directly on a 5 Å underlayer of molybdenum, which was deposited over the same 30 Å layer of TiN on a silicon support as used in the comparative example, after annealing via the same rapid temperature processing as the comparative example at 950° C. for 30 seconds in a nitrogen atmosphere, resulted in a ruthenium surface having a thickness ranging from about 192 Å to about 258 Å.

A ruthenium layer for a comparative example in which a 200 Å ruthenium layer was deposited via physical vapor deposition directly on a 30 Å layer of TiN on a silicon support resulted in a center point sheet resistance of about 6.2 as deposited, about 4.7 after RTP at 950° C. for 30 seconds in nitrogen, and about 4.8 after RTP at 950° C. for 30 seconds in argon.

In another comparative example, a 5 Å layer of molybdenum was deposited directly over a 200 Å ruthenium layer deposited via physical vapor deposition directly on a 30 Å layer of TiN on a silicon support resulted in a center point resistance of about 6.1 as deposited, about 5.9 after RTP at 950° C. for 30 seconds in nitrogen, and about 6.0 after RTP at 950° C. for 30 seconds in argon.

200 Å ruthenium layer was deposited via An inventive example in which a 200 Å ruthenium layer was deposited via physical vapor deposition directly on 5 Å layer of molybdenum, which was deposited directly over the a 30 Å layer of TiN on a silicon support according to embodiments disclosed herein resulted in a center point sheet resistance of about 8.0 as deposited, about 4.1 after RTP at 950° C. for 30 seconds in nitrogen, and about 4.2 after RTP at 950° C. for 30 seconds in argon. As these data show, the center point resistance of the top layer is greatly reduced in comparison to both the as deposited layer (without annealing), and the comparative examples. As these data further show, the annealing in nitrogen is essentially equivalent to annealing in argon.

TABLE 1

| Condition | Ru200A TiN30A Si (comparative) | Mo5A Ru200A TiN30A Si (comparative) | Ru200A Mo5A TiN30A Si |
|---|---|---|---|
| As deposited | | | |
| Ra (nm) | 0.245 | 0.222 | 0.706 |
| Rq (nm) | 0.314 | 0.279 | 0.893 |
| RTP 950° C. - N2 30 s | | | |
| Ra (nm) | 2.4 | 1.393 | 0.842 |
| Rq (nm) | 2.996 | 2.852 | 1.222 |
| RTP 950° C. - Ar 30 s | | | |
| Ra (nm) | 2.42 | 1.572 | 1.439 |
| Rq (nm) | 3.017 | 3.119 | 1.875 |

As these data show, there is a substantial reduction in roughness of the ruthenium layer deposited over the molybdenum underlayer according to embodiments of the disclosure.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. While the foregoing is directed to embodiments of the present disclosure, other and further embodiments of the disclosure may be devised without departing from the basic scope thereof.

The invention claimed is:

1. A method to produce a layered substrate, comprising:
   depositing a diffusion barrier layer on the substrate;
   depositing an underlayer comprising a Group 6 metal on the barrier layer; and
   depositing a ruthenium layer comprising ruthenium on the underlayer, to produce the layered substrate;
   wherein the method further comprises annealing of the layered substrate by heating of the layered substrate at a temperature of greater than or equal to about 800° C. in an oxygen free environment, for a period of time of greater than or equal to about 5 seconds and less than or equal to about 500 seconds; and
   wherein an upper surface of the annealed layered substrate has an average roughness Ra of less than or equal to about 10 nm, and/or the upper surface of the annealed layered substrate has a root mean square roughness Rq of less than or equal to about 10 nm.

2. The method of claim 1, wherein the diffusion barrier layer comprises titanium nitride $Ti_aN_x$, tantalum nitride, $Ta_aN_x$, zirconium nitride $Zr_aN_x$, wherein each a is independently from 1 to 3 and x is from 1 to 5 to result in a neutral compound; titanium zirconium nitride $Ti_cZr_dN_x$, wherein c+d equals an integer from 1 to 3 and x is from 1 to 5 to result in a neutral compound; or a combination thereof.

3. The method of claim 1, wherein the diffusion barrier layer further comprises less than or equal to about 1 weight percent of the Group 6 metal present in the underlayer.

4. The method of claim 1, wherein the underlayer has a thickness which is less than a thickness of the ruthenium layer.

5. The method of claim 1, wherein the underlayer has a thickness of greater than or equal to about 0.5 nm, and less than or equal to about 10 nm.

6. The method of claim 1, wherein the underlayer comprises molybdenum.

7. The method of claim 1, wherein the underlayer consists essentially of molybdenum.

8. The method of claim 1, wherein the ruthenium layer consists essentially of ruthenium.

9. The method of claim 1, wherein the ruthenium layer has a thickness of greater than or equal to about 5 nm, and less than or equal to about 1000 nm.

10. The method of claim 1, wherein the underlayer and the ruthenium layer are individually deposited via physical vapor deposition.

11. The method of claim 1, wherein the oxygen free environment comprises nitrogen, argon, neon, krypton, hydrogen, or a combination thereof.

12. A method to produce a layered substrate, comprising:
    depositing a diffusion barrier layer on the substrate;
    depositing an underlayer comprising a Group 6 metal on the barrier layer; and
    depositing a ruthenium layer comprising ruthenium on the underlayer, to produce the layered substrate;
    wherein the method further comprises annealing of the layered substrate by heating of the layered substrate at a temperature of greater than or equal to about 800° C., in an oxygen free environment, for a period of time of greater than or equal to about 5 seconds and less than or equal to about 500 seconds; and
    wherein the ruthenium layer has a center point resistivity of less than or equal to about 10 ohm-cm.

13. A method to produce a layered substrate, comprising:
depositing a diffusion barrier layer on the substrate;
depositing an underlayer comprising a Group 6 metal on the barrier layer; and
depositing a ruthenium layer comprising ruthenium on the underlayer, to produce the layered substrate;
wherein the method further comprises annealing of the layered substrate by heating of the layered substrate at a temperature of greater than or equal to about 800° C., in an oxygen free environment, for a period of time of greater than or equal to about 5 seconds and less than or equal to about 500 seconds; and further comprising depositing a nitride capping layer on an upper surface of the annealed layered substrate.

14. The method of claim 13, wherein the nitride capping layer comprises silicon nitride.

* * * * *